United States Patent [19]

Engle, Jr.

[11] 4,223,048
[45] Sep. 16, 1980

[54] PLASMA ENHANCED CHEMICAL VAPOR PROCESSING OF SEMICONDUCTIVE WAFERS

[75] Inventor: George M. Engle, Jr., San Jose, Calif.

[73] Assignee: Pacific Western Systems, Mountain View, Calif.

[21] Appl. No.: 931,565

[22] Filed: Aug. 7, 1978

[51] Int. Cl.² .................... C23C 13/12; H01L 21/443; B05D 5/12

[52] U.S. Cl. ..................... 427/39; 427/86; 427/94; 427/95; 427/255.3; 118/503; 118/723; 118/728

[58] Field of Search ............. 427/39, 93, 94, 255, 427/86, 95, 248 C; 118/49.1, 503, 723, 728; 204/192 E

[56] References Cited

U.S. PATENT DOCUMENTS

| | | | |
|---|---|---|---|
| 3,472,679 | 10/1969 | Ing | 427/93 |
| 4,018,184 | 4/1977 | Nagasawa | 118/49.1 |
| 4,066,037 | 1/1978 | Jacob | 427/39 |
| 4,098,923 | 7/1978 | Alberti | 427/93 |
| 4,098,924 | 7/1978 | McLouski | 427/93 |
| 4,141,811 | 2/1979 | Yerkes | 204/192 E |
| 4,142,004 | 2/1979 | Hauser | 427/39 |
| 4,147,432 | 4/1979 | Yamawaki | 118/49.1 |

*Primary Examiner*—Ralph S. Kendall
*Attorney, Agent, or Firm*—Harry E. Aine; Harvey G. Lowhurst

[57] ABSTRACT

Semiconductive wafers are processed, i.e., etched or layers deposited thereon, by means of a plasma enhanced chemical vapor processing system. The processing system includes an evacuable horizontal tubular envelope disposed within a surrounding heater or furnace for maintaining, the case of deposition, a region of uniform temperature within the central region of the elongated tubular envelope. Two sets of interleaved generally planar electrodes are disposed within the evacuable envelope for establishing an electrical plasma discharge in the process gaps defined between the interleaved electrodes. Wafers are loaded into the processing gaps vertically with the major face of each wafer facing into the process gap. The mutually opposed surfaces of the interleaved electrodes are preferably lined with a material of the same conductivity as that of the bulk material of the wafer to enhance the uniformity of the processing. The chemical vapor is caused to flow axially through the evacuable tube, and through the electrical plasma discharge established in the processing gaps at subatmospheric pressure, to produce chemically active vapor products of the plasma discharge which interact with the faces of the wafers facing into the processing gaps for processing of the wafers.

15 Claims, 7 Drawing Figures

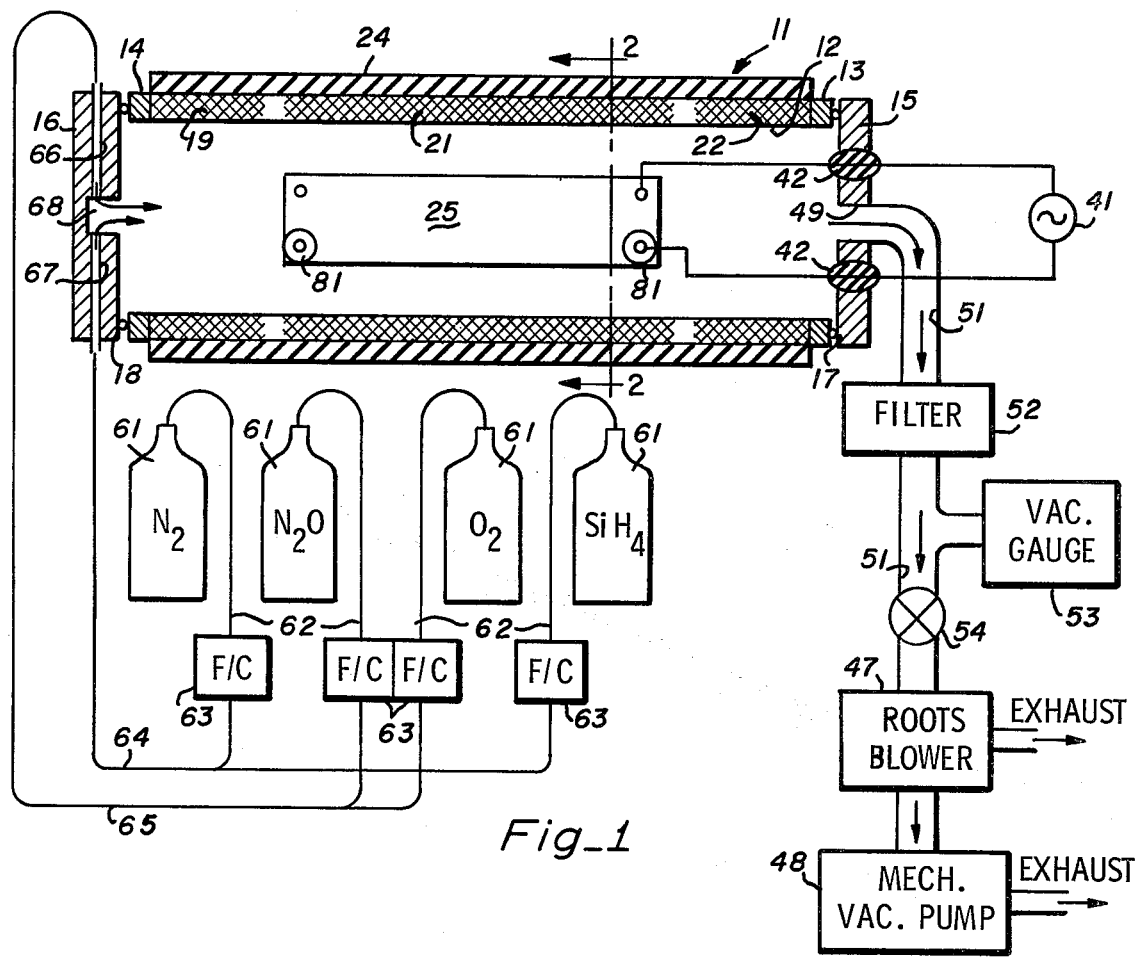
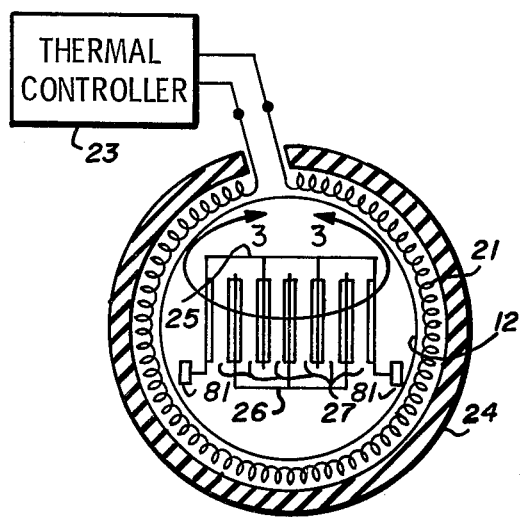
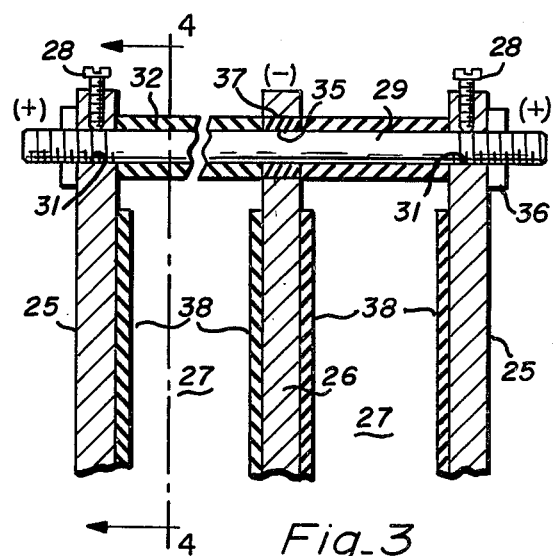
Fig_1
Fig_2
Fig_3

U.S. Patent  Sep. 16, 1980  Sheet 2 of 2  4,223,048
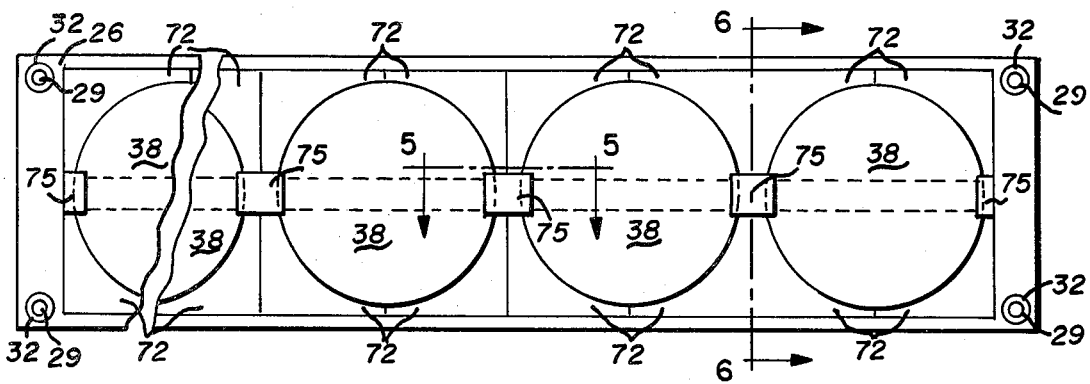
Fig_4
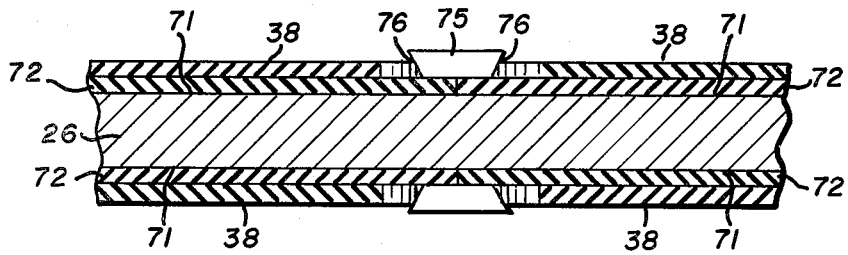
Fig_5
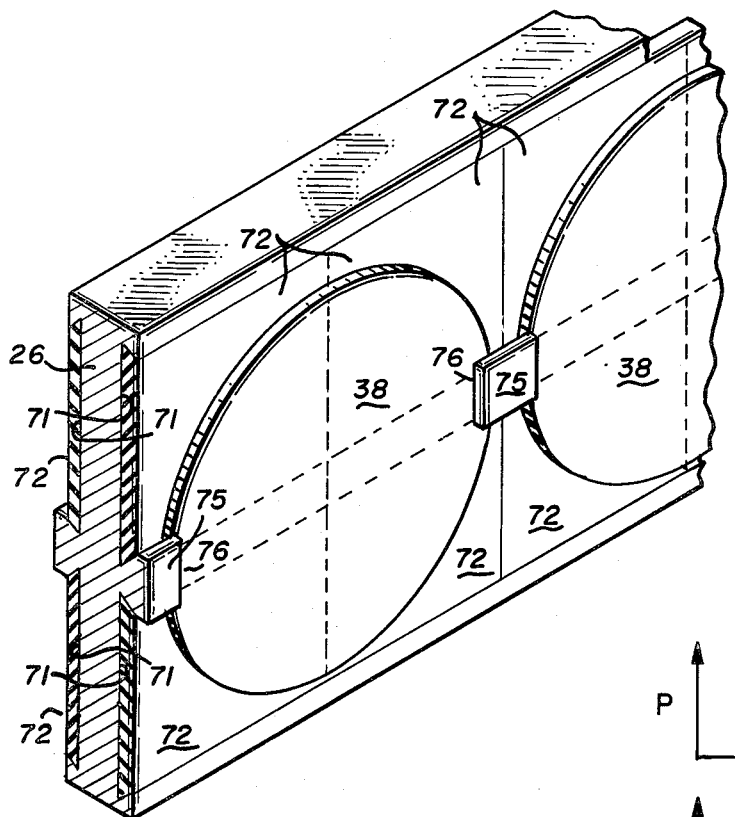
Fig_6
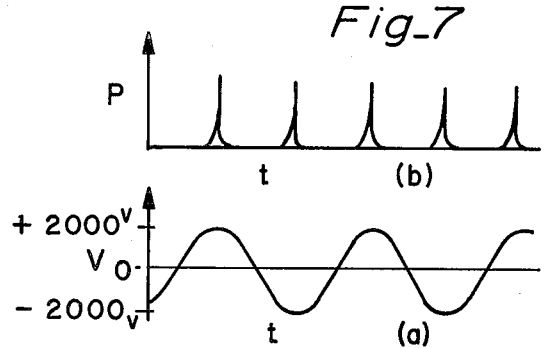
Fig_7

PLASMA ENHANCED CHEMICAL VAPOR PROCESSING OF SEMICONDUCTIVE WAFERS

BACKGROUND OF THE INVENTION

The present invention relates in general to plasma enhanced vapor processing of semiconductive wafers and, more particularly, to etching or depositing certain films or layers on the wafers, such films or layers comprising, for example, silicon nitride, silicon dioxide, polysilicon, metallic layers, etc.

DESCRIPTION OF THE PRIOR ART

Heretofore, plasma enhanced chemical vapor processing of semiconductive wafers has been conducted in one or the other of two types of plasma reactors, i.e., either a barrel or planar type reactor.

The barrel type reactor is suited only for plasma etching of materials such as, silicon, polysilicon, and silicon nitride. Barrel reactors provide greater wafer throughput than planar reactors, permitting up to 50 wafers to be etched in a single batch, depending on the physical size of the reactor. Etching in a barrel reactor is isotropic, i.e., travelling in all directions at the same rate, and the etching is always done inside of a perforated conductor, i.e., etch tunnel, where no electric fields or ions are present. Free radicals do the etching. Lines being etched on a wafer grow narrower as they are etched deeper. In the barrel reactor, the wafers are loaded on the axis of a horizontal tubular envelope with the normals to the major faces of the wafers being substantially colinear with the longitudinal axis of the tubular envelope, as of quartz. The plasma discharge is established in an annular region surrounding the etch tunnel via electrodes disposed on the outside of the tubular envelope. The chemically active products of the plasma discharge pass through the perforations in the etch tunnel for interaction at the major faces of the wafers for etching of the wafers.

The planar reactor is more versitile. These reactors are suitable for etching aluminum and preferentially etching oxide over silicon and also for stripping of photoresist film surfaces that cannot tolerate oxidation. In addition, the planar reactor is utilized for deposition of films or layers such as, silicon nitride, silicon oxide, polysilicon, etc. In the planar reactor, the wafers lie directly in the plasma glow discharge produced between a pair of horizontal capacitive plates and are continually exposed to electrons and ions. The directional aspect of the electric field is utilized to produce a highly anisotropic etching process. Unlike isotropic processes, the etched lines on a wafer do not grow wider as they grow deeper. Planar reactors have less wafer capacity than barrel reactors. However, planar reactors can be more fully automated for wafer handling. Less operator attention is needed, so throughput is increased.

Heretofore, only the planar type reactors have been employed for depositing films or layers upon semiconductive wafers due to the short lifetimes of the reactive vapor species produced in the glow discharge. This last factor is probably the major reason for the failure of the horizontal tube-type reactors, with stand up wafer loading, to be of practical importance for the uniform plasma deposition of passivation films, such as silicon nitride.

In the barrel type plasma reactor, power for plasma generation is induced either inductively with an external coil or capacitively with plates outside the reaction chamber. The designs lead to a significant radial variation in the electromagnetic field density, and hence to a large thickness variation in the deposited layer across a wafer positioned vertically. In contrast, the field density in the planar type reactor configuration, in which the wafer to be processed rests upon one plate of a two plate capacitively coupled reaction zone, is reasonably uniform and controllable. This approach lends itself most readily to the uniform deposition of films over large surfaces. Commercial planar machines, with diameters up to 60 centimeters, are now bieng widely used for the deposition of plasma enhanced nitride films.

A planar plasma reactor for depositing silicon nitride is disclosed in U.S. Pat. No. 4,066,037 issued Jan. 3, 1978. The state of the art in plasma processing of semiconductive wafers is disclosed in a series of articles appearing in *Solid State Technology*, of April 1978, pages 89-132.

SUMMARY OF THE PRESENT INVENTION

The principal object of the present invention is the provision of an inproved plasma enhanced chemical vapor processing method and apparatus for processing of semiconductive wafers.

In one feature of the present invention, first and second sets of interleaved electrodes are provided for disposition within an evacuable chamber for establishing electric plasma discharge process gaps in the spaces between the adjacent electrodes, whereby the number of wafers that can be loaded into the processing region is substantially increased for direct contact with the plasma enhanced vapor products utilized for deposition or etching.

In another feature of the present invention, the plasma enhanced chemical vapor processing apparatus includes an elongated tubular evacuable envelope horizontally mounted within a surrounding furnace for elevating the temperature of the wafers being processed within the apparatus.

In another feature of the present invention, the interleaved electrodes are coated or lined with a material having a conductivity approximately equal to that of the bulk semiconductive material being processed and preferably the lining material is of the same type conductivity as that of the semiconductive wafers being processed, whereby uniformity of the processing is substantially enhanced.

Other features and advantages of the present invention will become apparent upon a perusal of the following specification taken in connection with the accompanying drawings wherein:

BRIEF DESCRIPTION OF THE DRAWINGS

FIG. 1 is a schematic longitudinal sectional view, partly in block diagram form, of a plasma enhanced chemical vapor orocessing apparatus incorporating features of the present invention, FIG. 2 is a transverse sectional view of a portion of the structure of FIG. 1 taken along line 2—2 in the direction of the arrows, FIG. 3 is an enlarged transverse forshortened detail view of a portion of the structure of FIG. 2 delineated by line 3—3, FIG. 4 is a longitudinally forshortened view of a portion of the structure of FIG. 3 taken along line 4—4 in the direction of the arrows, FIG. 5 is an enlarged transverse sectional view of a portion of the structure of FIG. 4 taken along line 5—5 in the direction of the arrows, FIG. 6 is an enlarged sectional perspective view of a portion of the structure of FIG. 4 taken along line 6—6 in the direction of the arrows, FIG. 7 is a plot of power, P, and voltage, V, vs time depicting the power consumption of the plasma as a function of the applied voltage for the plasma enhanced processing apparatus of FIG. 1.

DESCRIPTION OF THE PREFERRED EMBODIMENTS

Referring now to FIGS. 1 and 2 there is shown a plasma enhanced chemical vapor processing apparatus 11 for processing semiconductive wafers and incorporating features of the present invention. The processing system 11 includes an elongated tubular evacuable envelope 12, as of quartz, having an inside diameter of 155 millimeters. Opposite ends of the tubular envelope 12 are outwardly flanged at 13 and 14, respectively, to receive closing end caps structures 15 and 16, respectively, as of aluminum. Rubber O-ring seals 17 and 18, respectively, provide a gas-tight seal between the respective end caps 15 and 16 and the flanged ends of the tubular envelope 12.

A three segment resistance heating element 19, 21, and 22 surrounds the tubular envelope 12. The resistance heating elements are heated to the desired temperature by means of currents fed therethrough from a thermal controller 23. Thermocouples, not shown, are contained within the envelope for sensing the temperature therein. The output current from the thermal controller 23 is adjusted for obtaining the desired operating temperature within the tubular envelope 12. The heating element is surrounded by a thermally insulative jacket 24 as of asbestos. The thermal controller 23, heating elements, and insulative jacket comprise a furnace which is commercially available as a diffusion furnace from Mel Pat Industries of Santa Cruz, Calif.

First and second sets of interleaved generally planar elongated electrodes 25 and 26 (See FIGS. 1-4) are disposed within the central region of the elongated tubular envelope 12 for defining a plurality of processing gaps 27 in the spaces between the interleaved electrodes 25 and 26. In a typical example, there are seven interleaved electrode plates 25 and 26, as of graphite, to define six processing gaps 27.

The electrodes 25 of the first set are electrically conductively connected together by means of screws 28 passing through the electrodes and bearing in an electrically conductive contact with an electrically conductive rod 29, as of stainless steel, passing transversely through aligned openings 31 in the first set of electrode plates 25. Four such rods 29 are provided one at each of the four corners of the rectangular electrode plates 25 and 26. Electrically insulative sleeve 32, as of quartz, are coaxially mounted on the rods 29 between adjacent electrodes 25 and 26 for maintaining the spacing therebetween, as of 9/16th of an inch.

The two sets of electrode plates 25 and 26 are electrically insulated one relative to the other by means of cylindrical sleeves 35, as of quartz, mounted on the transverse rods 29 at the positions where the rods 29 pass through the electrodes which are to be insulated from the other set of electrodes 36. Nuts are tightened over the threaded ends of the rods 29 for putting the interleaved electrode assembly in compression. Apertures 37 in the electrodes to be insulated from rod 29 are larger than the corresponding apertures 31 in the other set of electrode plates in order to accommodate the insulative sleeve 35.

The semiconductive wafers 38, which are to be processed, are disposed with one major face adjacent the electrode 25 or 26 and the other major face facing into the processing gap 27. The method by which the wafers 38 are attached to the electrodes 25 and 26 will be more fully described, below, with regard to FIGS. 4-6.

The first and second interleaved electrode sets 25 and 26 are connected to opposite terminals of an RF power supply 41 via the intermediary of feedthrough insulators 42 passing through end cap 15. The fedthrough conductors are coupled to the respective electrodes sets 25 and 26 within the tubular envelope 12, so that when one set of the electrodes, for example 25, is positive the other set of electrodes 26 is negative with a potential difference, V, between teh electrodes having a waveform of the type shown by waveform (b) of FIG. 7. In a typical example, the R.F. generator 41 has a frequency of 450 kilohertz.

The evacuable chamber 12 is evacuated by means of a roots blower 47 and a mechanical vacuum pump 48 connected in gas communication with chamber 12 via exhaust port 49, centrally disposed of the end cap 15, and exhaust tubulation 51. A particle filter 52 is connected in the exhaust tubulation 51 for collecting particulate matter and preventing the back streaming of oil and other contaminants from the vacuum pumps 47 and 48 back into the evacuated chamber 12. A vacuum gauge 53 is coupled into the exhaust tubulation 51 for monitoring the pressure within the evacuable chamber 12 and a valve 54 is connected in the exhaust tubulation 51 for valving off the system 11 from the pumps 47 and 48.

Gases to be employed in the chemical vapor processing apparatus 11 are contained within bottles 61 connected in gas communication with the evacuable chamber 12 via tubulation 62 and flow controllers 63. The output of the flow controllers 63 is fed to respective manifolds 64 and 65 which are connected to radially directed flow passageways 66 and 67, respectively, located in diametrically opposed relation in end cap 16 and feeding into a central recess 68 formed in the end cap 16. In operation, the flow of the gaseous vapor constituents is axially of the evacuable tube 12 and interleaved electrode structure 25 and 26 to the exhaust port 49 and thence via the exhaust tubulation 51 to the pumps 47 and 48.

Referring now to FIGS. 4-6 the method of attachment of the wafers 38 to the electrodes 25 and 26 is more fully disclosed, more particularly, the major faces of the plate shaped electrodes 25 and 26 are recessed at 71 to define two elongated rectangular recesses running lengthwise of the respective electrode plates 25 and 26. Rectangular plate like segments of a semiconductive material having approximately the same conductivity as that of the wafer 38, which is to be processed, is inserted within each of the recesses 71 to provide a lining 72 of the electrodes 25 and 26. The lining segments 72 are conveniently formed by dicing rejected semiconductive wafers 38. In a preferred embodiment, the sem conductive material 72 is the same type conductivity, i.e., type N or type P as that of the bulk material of the wafers 38 to be processed. Also, the lining 72 should have the same electrical conductivity as that of the wafers 38 and, therefore, by making the lining 72 from discarded wafers 38 an excellent match is obtained between the conductivity of the lining 72 and the conductivity of the wafer 38. It is believed that the lining 72 serves to make the impedance of the plasma discharge gap 27 uniform throughout the region of the processing gap 27 with the wafers in place and thus to provide a uniform chemical reaction, at the major faces of the wafers 38, with the ractive products of the plasma discharge.

As an alternative to lining the electrodes 25 and 26 with separate pieces of lining material 72, the electrodes 25 and 26 may be lined by coating same with insulative or semiconductive material, such as a coating 10,000 Å thick of undoped $SiO_2$ on graphite electrodes 25 and 26.

The semiconductive wafers are captured adjacent the liner 72 by means of tab portions 75 of the electrode positioned slightly below the center line of the wafers 38 and including a recessed lip portion 76 which overlays slightly a marginal edge portion of the respective wafer for capturing the wafer, in the vertical position to the respective electrode 25 or 26. In a typical example for three inch wafers, the interleaved electrodes 25 and 26 are 27 inches long and 3.5 inches wide and 3/16 inch thick for holding between 70 and 84 wafers in a single batch.

EXAMPLE

For deposition of a silicon dioxide layer of a refractive index of 1.45 to a thickness of 10,000 angstroms on P type silicon wafers 38, the furnace is set such that the temperature within the central region of the evacuable tube 12 is 340° C. The chamber 12 is loaded with wafers 38 and is evacuated to a pressure of $10^{-2}$ torr for a period of approximately 1 minute. At this point, nitrogen gas at a flow rate of 1500 cc per minute is introduced into the chamber 12 from the source of nitrogen gas 61 via the flow controller 63 and manifold 64 for purging the system with nitrogen for a period of between 2 and 3 minutes. Next, the nitrogen is turned off and the pressure of the chamber 12 is stabilized at 0.5 torr, then, the $SiH_4$ is turned ON at a flow rate of 50 cc per minute; the oxygen is turned ON at a flow rate of between 10 and 20 cc per minute; and $N_2O$ is turned ON at a flow rate of approximately 1000 liters per minute. After a period of approximately 30 seconds, the RF generator 41 is turned ON to provide approximately 20 watts of average power into the plasma discharge established in the process gaps 27.

The aforecited flow rates result in deposition of silicon dioxide at a rate of approximately 500 angstroms per minute. After 20 minutes, a layer of silicon dioxide, approximately 10,000 angstroms thick has been deposited upon the major faces of the wafers 38 which face into the respective processing gaps 27.

Next, the power is turned OFF, the gas flows are turned OFF, the system is pumped down to $10^{-2}$ torr. The evacuable envelope is then purged with a flow of nitrogen at 1500 cc per minute for a period of 1 to 2 minutes. The vacuum pumps 47 and 48 are then valved off from the chamber 12 and then the pumps, are turned OFF. The chamber 12 is then filled with nitrogen and brought back to atmospheric pressure with nitrogen. The end cap 15 is then removed and the electrode structure 25 and 26 is withdrawn from the tubular chamber 12 on its wheels 81. The wheels 81, as of quartz, are mounted on the ends of the lowermost rods 29 of the composite interleaved electrode structure and ride on the inside wall of the envelope 12.

For plasma enhanced chemical vapor etching of semiconductive wafers, the aforedescribed apparatus is used except that the etchant gas may comprise $C_2F_6$ or $CF_4$ plus oxygen and the furnace is not needed as etching may take place at room temperature. For various plasma enhanced chemical vapor processing examples for either etching or depositing, see the aforecited state of the art articles, appearing in Solid State Technology.

The advantage to the plasma enhanced chemical vapor processing of semiconductive wafers in accordance with the present invention is that the wafer throughout capacity is substantially increased as contrasted with the piror art planar geometry. The vertical positioning of the wafers 38 results in less particulate contamination of the processed wafers than had heretofore been achieved with the prior art pancake or planar geometry. It is believed that peel off of deposited material from within the reaction chamber 12 contributed to the prior art particulate contamination in the planar geometry where the wafers are loaded horizontally. The uniformity of the wafer processing in accordance with the present invention is better than 3% intrawafer and better than 5% front wafer to back wafer interwafer uniformity.

What is claimed is:

1. In a method of plasma enhanced chemical vapor processing of semiconductive wafers wherein an evacuable envelope contains first and second sets of interleaved electrodes one set being electrically insulated relative to the other for establishing an electrical plasma discharge within said evacuable envelope in the processing gaps between said interleaved electrodes, the steps of:
   loading semiconductive wafers into the processing gaps between adjacent interleaved electrodes of said first and second sets with one major face of each wafer being disposed facing an adjacent electrode and the other major face of each wafer facing into the processing gap defined between adjacent ones of said first and second electrodes;
   evacuating said envelope to subatmospheric pressure;
   introducing a vapor at subatmospheric pressure into said envelope;
   establishing an electrical plasma discharge at subatmospheric pressure in the processing gaps between said interleaved first and second sets of electrodes to produce chemically active vapor products of said plasma discharge; and
   chemically interacting said chemically active vapor products with said major faces of said wafers which face into said processing gaps for processing of said wafers.

2. The method of claim 1 wherein said electrodes are spaced apart horizontally and wherein said wafers are loaded so that the normals to the major faces of the semiconductive wafers lie approximately in the horizontal plane.

3. The method of claim 1 including the step of, heating said wafers within said envelope to promote a desired chemical reaction at the major faces of said wafers which faces into said processing gaps.

4. The method of claim 1 including the step of, lining at least portions of the mutually opposed major faces of said first and second sets of electrodes with a material having an electrical conductivity such that tye electrical impedance of the plasma gap with the wafers in place is generally uniform throughout the processing gaps.

5. The method of claim 1 including the step of lining at least portions of the mutually opposed faces of said first and second sets of electrodes with a semiconductive material to the same type conductivity as that of said wafers.

6. In a plasma enhanced chemical vapor processing apparatus for processing semiconductive wafers within an evacuable envelope for containing the plasma enhanced chemical vapor and semiconductive wafers at subatmospheric pressure;

first and second sets of electrode means for disposition within the envelope, one set of said electrode means being electrically insulated from the other and said first and second sets of electrode means being interleaved with each other for establishing, when energized with electrical potential, an electrical plasma discharge within said evacuable envelope in the processing gaps between adjacent ones of said interleaved electrode means; and means for loading semiconductive wafers into the gaps between adjacent interleaved electrode means, of said interleaved first and second sets, with the wafers being loaded with one major face of each wafer to be disposed facing an adjacent electrode and the other major face of each wafer facing into the processing gap defined between adjacent ones of said first and second sets of interleaved electrodes.

7. The apparatus of claim 6 wherein said first and second sets of electrode means include first and second sets of generally planar electrodes with the major faces of adjacent electrode means disposed in mutually opposed horizontally spaced relation to define a plurality of processing gaps in the regions between the horizontally spaced electrode means.

8. The apparatus of claim 6 including said evacuable envelope means and wherein said evacuable envelope means includes an elongated tubular portion for containing said electrode means and loaded semiconductive wafers therewithin.

9. The apparatus of claim 8 including means for introducing a flow of chemical vapor through said tubular envelope portion and through said interleaved electrode means generally axially of said tubular envelope portion at subatmospheric pressure.

10. The apparatus of claim 9 including power supply means for energizing said first and second sets of electrode means with a potential difference therebetween to establish an electrical plasma discharge at subatmospheric pressure in the process gap regions between said interleaved said first and second sets of electrodes to produce chemically active vapor products of said plasma discharge and for chemically interacting said chemically active vapor products with said major faces of said wafers which face into said processing gaps for processing of said wafers.

11. The apparatus of claim 8 including, heating means disposed surrounding said elongated tubular portion of said envelope means for heating the interior of said tubular envelope and the loaded wafers to an elevated processing temperature.

12. The apparatus of claim 6 including means for lining at least portions of said mutually opposed major faces of said first and second sets of electrodes with a material having an electrical conductivity such that the electrical impedance of the processing gaps with the wafers in place is generally uniform throughout the processing gaps.

13. The apparatus of claim 6 including means for lining at least portions of the mutually opposed major faces of said first and second sets of electrodes with a semiconductive material of the same type conductivity as that of said wafers to be processed.

14. In a plasma enhanced chemical vapor processing apparatus for processing workpieces within an evacuable envelope for containing the plasma enhanced chemical vapor and workpieces at subatmospheric pressure;

first and second sets of electrode means for disposition within the envelope, one set of said electrode means being electrically insulated from the other and said first and second sets of electrode means being interleaved with each other for establishing, when energized with electrical potential, an electrical plasma discharge within said evacuable envelope in the processing gaps between adjacent ones of said interleaved electrode means, and means for loading workpieces into the gaps between adjacent interleaved electrode means, of said interleaved first and second sets.

15. In a plasma enhanced chemical vapor processing apparatus for processing workpieces within an evacuable envelope for containing the plasma enhanced chemical vapor and workpieces at subatmospheric pressure;

first and second electrode means for disposition within the envelope, one of said electrode means being electrically insulated from the other and said first and second electrode means being disposed adjacent each other for establishing a plasma discharge within said evacuable envelope in the processing gaps between adjacent ones of said electrode means;

means for loading workpiece into the gap between adjacent electrode means, and means for lining at least portions of said mutually opposed faces of said first and second electrode means with a material having an electrical conductivity such that the electrical impedance of the processing gap with the workpieces in place is generally uniform throughout the processing gaps.

* * * * *